US012690227B2

(12) United States Patent (10) Patent No.: US 12,690,227 B2
Sugimoto et al. (45) Date of Patent: Jul. 21, 2026

(54) SEMICONDUCTOR DEVICE

(71) Applicant: FLOSFIA INC., Kyoto (JP)

(72) Inventors: Masahiro Sugimoto, Kyoto (JP);
Shinpei Matsuda, Kyoto (JP); Yasushi Higuchi, Kyoto (JP); Kazuyoshi Norimatsu, Kyoto (JP)

(73) Assignee: FLOSFIA INC., Kyoto (JP)

( * ) Notice: Subject to any disclaimer, the term of this patent is extended or adjusted under 35 U.S.C. 154(b) by 379 days.

(21) Appl. No.: 18/384,121

(22) Filed: Oct. 26, 2023

(65) Prior Publication Data

US 2024/0055510 A1 Feb. 15, 2024

Related U.S. Application Data

(63) Continuation-in-part of application No. PCT/JP2022/018788, filed on Apr. 25, 2022.

(30) Foreign Application Priority Data

Apr. 26, 2021 (JP) ................................. 2021-074520

(51) Int. Cl.
| | |
|---|---|
| *H10D 30/66* | (2025.01) |
| *H10D 62/80* | (2025.01) |
| *H10D 99/00* | (2025.01) |
| *H10P 14/20* | (2026.01) |

(Continued)

(52) U.S. Cl.
CPC .............. *H10D 30/66* (2025.01); *H10D 62/80* (2025.01); *H10D 99/00* (2025.01); *H10P 14/24* (2026.01); *H10P 14/3434* (2026.01); *H02P 27/06* (2013.01)

(58) Field of Classification Search
CPC ........ H10D 30/66; H10D 62/80; H10D 99/00; H01L 21/02565; H01L 21/0262; H10P 14/24; H10P 14/3434
See application file for complete search history.

(56) References Cited

U.S. PATENT DOCUMENTS

| | | | | |
|---|---|---|---|---|
| 10,847,647 B2 * | 11/2020 | Sabri | ...................... | H10D 30/66 |
| 2012/0007104 A1 * | 1/2012 | Wada | ................... | H10D 12/031 |
| | | | | 257/E21.054 |

(Continued)

FOREIGN PATENT DOCUMENTS

| | | |
|---|---|---|
| JP | 2018-60992 | 4/2018 |
| JP | 2018-186246 | 11/2018 |

OTHER PUBLICATIONS

International Search Report (ISR) issued Aug. 30, 2022 in International (PCT) Application No. PCT/JP2022/018788.

(Continued)

*Primary Examiner* — Eugene Lee
(74) *Attorney, Agent, or Firm* — Wenderoth, Lind & Ponack, L.L.P.

(57) ABSTRACT

Provided a semiconductor device includes at least: a crystalline oxide semiconductor layer including a channel layer, a drift layer, and a source region; a gate electrode arranged over the channel layer across a gate insulating film; a current blocking region arranged between the channel layer and the drift layer; and a source electrode provided on the source region. The current blocking region is composed of a high-resistance layer. The source electrode forms a contact with the current blocking region.

10 Claims, 11 Drawing Sheets

(51) Int. Cl.
    *H10P 14/24*        (2026.01)
    *H02P 27/06*        (2006.01)

(56)                 References Cited

U.S. PATENT DOCUMENTS

| | | | |
|---|---|---|---|
| 2013/0075756 A1* | 3/2013 | Arthur | H10D 30/66 |
| | | | 257/77 |
| 2013/0292702 A1* | 11/2013 | Horii | H01L 21/046 |
| | | | 257/77 |
| 2017/0179249 A1 | 6/2017 | Oda et al. | |
| 2018/0286684 A1* | 10/2018 | Fujii | H10D 62/106 |
| 2020/0006575 A1* | 1/2020 | Dewey | H10D 84/038 |
| 2020/0098930 A1* | 3/2020 | Le | H10D 30/6743 |
| 2020/0144377 A1 | 5/2020 | Higashiwaki et al. | |
| 2020/0161442 A1* | 5/2020 | Gorczyca | H10D 64/01 |
| 2020/0258884 A1* | 8/2020 | Rachmady | H10D 30/021 |
| 2020/0388685 A1* | 12/2020 | Sharma | H10D 62/83 |
| 2021/0083122 A1* | 3/2021 | Naylor | H10D 30/6755 |
| 2022/0059424 A1* | 2/2022 | Hashigami | C23C 16/4481 |
| 2023/0006049 A1* | 1/2023 | Das | H10D 62/8325 |

OTHER PUBLICATIONS

Man Hoi Wong et al., "Enhancement-Mode β-$Ga_2O_3$ Current Aperture Vertical MOSFETs With N-Ion-Implanted Blocker", IEEE Electron Device Letters, vol. 41, No. 2, pp. 296-299, Feb. 2020.
Masataka Higashiwaki et al., "Latest progress in gallium-oxide electronic devices", Proceedings of SPIE, vol. 10533, p. 105330O-1 to 105330O-6, Feb. 23, 2018.

\* cited by examiner (a)

(b)

(c)

(d)

(e)

SEMICONDUCTOR DEVICE

CROSS REFERENCE TO RELATED APPLICATION

This application is a continuation-in-part application of International Patent Application No. PCT/JP2022/018788 (Filed on Apr. 25, 2022), which claims the benefit of priority from Japanese Patent Application No. 2021-074520 (filed on Apr. 26, 2021).

The entire contents of the above applications, which the present application is based on, are incorporated herein by reference.

FIELD OF THE INVENTION

The disclosure relates to a semiconductor device useful for power devices, and others.

DESCRIPTION OF THE RELATED ART

Gallium oxide ($Ga_2O_3$) is a transparent semiconductor having a wide bandgap from 4.8 to 5.3 eV at room temperature and absorbs very little visible light and ultraviolet light. For this reason, gallium oxide is a promising material for use particularly in opto-electronic devices to operate in a deep ultraviolet light region or in transparent electronics. In recent years, developments are under way on photodetectors, light-emitting diodes (LEDs), and transistors based on gallium oxide ($Ga_2O_3$). This gallium oxide becomes controllable in bandgap by using indium or aluminum alone, or a mixed crystal of a combination of indium and aluminum, and forms an extremely attractive family of materials as InAlGaO-based semiconductors. Here, the InAlGaO-based semiconductors indicate $In_XAl_YGa_ZO_3$ ($0 \leq X \leq 2$, $0 \leq Y \leq 2$, $0 \leq Z \leq 2$, $X+Y+Z=1.5$ to 2.5) and may be regarded as a family of materials including gallium oxide.

Gallium oxide ($Ga_2O_3$) has five crystal structures of $\alpha$, $\beta$, $\gamma$, $\sigma$, and $\epsilon$, and generally has $\beta$-$Ga_2O_3$ as the most stable structure.

SUMMARY OF THE INVENTION

According to an example of the present disclosure, there is provided a semiconductor device including at least: a crystalline oxide semiconductor layer including a channel layer, a drift layer, and a source region; a gate electrode arranged over the channel layer across a gate insulating film; a current blocking region arranged between the channel layer and the drift layer; and a source electrode provided on the source region, the current blocking region being composed of a high-resistance layer, the source electrode forming a contact with the current blocking region.

Thus, in a semiconductor device of the present disclosure, it is possible to provide a semiconductor device with excellent responsiveness.

DETAILED DESCRIPTION

Figure 1:
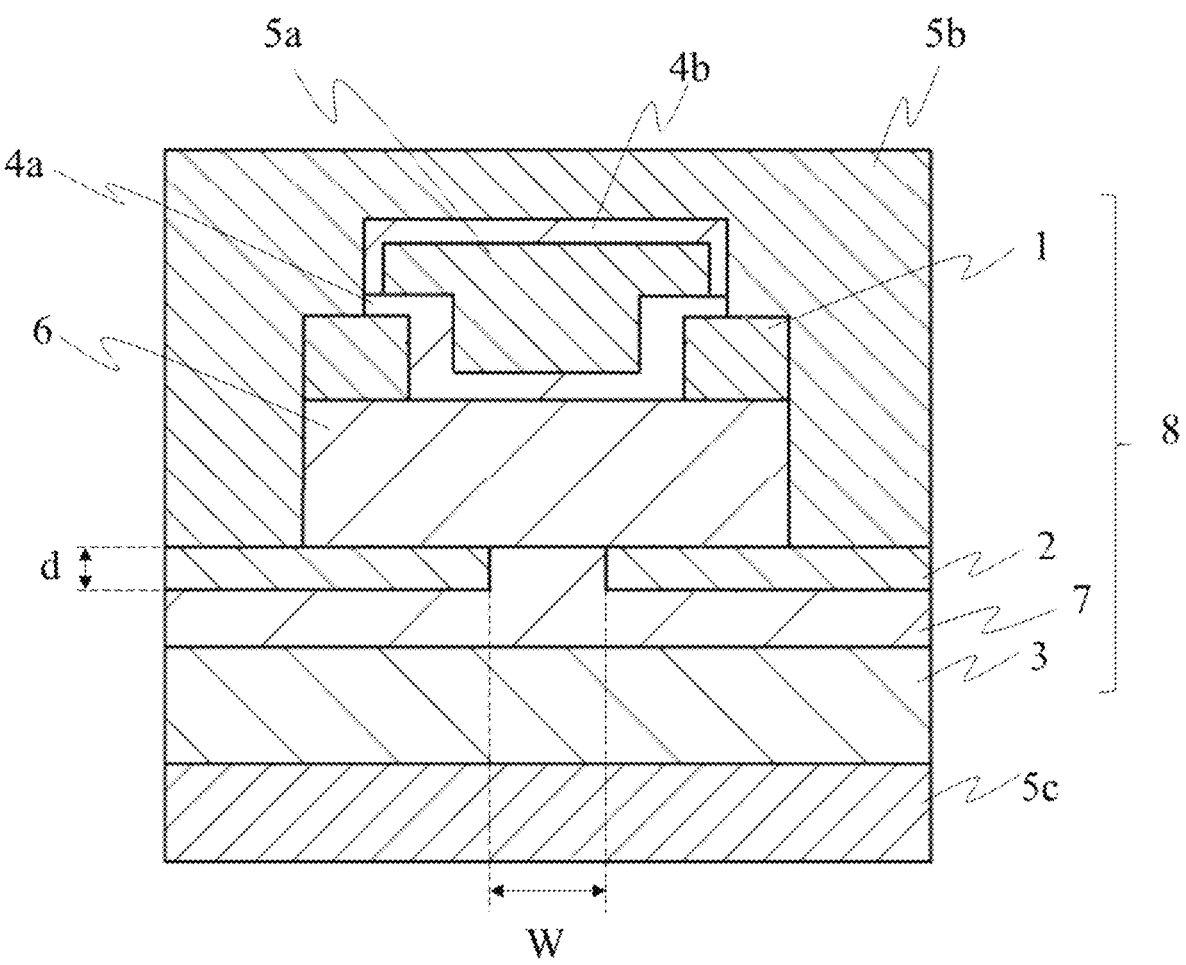
FIG. 1 is a view schematically illustrating a metal-oxide-semiconductor field-effect transistor (MOSFET) according to an embodiment of the disclosure.

The present inventors have found that, according to a semiconductor device including at least: a crystalline oxide semiconductor layer including a channel layer, a drift layer, and a source region; a gate electrode arranged over the channel layer across a gate insulating film; a current blocking region arranged between the channel layer and the drift layer; and a source electrode provided on the source region, the current blocking region being composed of a high-resistance layer, the source electrode forming a contact with the current blocking region, excellent withstand voltage performance and excellent responsiveness are achieved. Then, the present inventors have acquired knowledge that the semiconductor device obtained in this way is capable of solving the above-described conventional problem.

Embodiments of the present disclosure will be described below with reference to the accompanying drawings. In the following description, the same parts and components are designated by the same reference numerals. The present embodiment includes, for example, the following disclosures.

[Structure 1]

A semiconductor device including at least: a crystalline oxide semiconductor layer including a channel layer, a drift layer, and a source region; a gate electrode arranged over the channel layer across a gate insulating film; a current blocking region arranged between the channel layer and the drift layer; and a source electrode provided on the source region, the current blocking region being composed of a high-resistance layer, the source electrode forming a contact with the current blocking region.

[Structure 2]

The semiconductor device according to [Structure 1], wherein the source electrode directly contacts the current blocking region.

[Structure 3]

The semiconductor device according to [Structure 1] or [Structure 2], wherein the crystalline oxide semiconductor layer contains at least one type of metal selected from aluminum, indium, and gallium.

[Structure 4]

The semiconductor device according to any one of [Structure 1] to [Structure 3], wherein the crystalline oxide semiconductor layer has a corundum structure.

[Structure 5]

The semiconductor device according to any one of [Structure 1] to [Structure 4], wherein the current blocking region contains a dopant.

[Structure 6]

The semiconductor device according to [Structure 5], wherein the dopant in the current blocking region has a concentration equal to or greater than $1.0 \times 10^{17}/\text{cm}^3$.

[Structure 7]

The semiconductor device according to any one of [Structure 1] to [Structure 6], wherein the current blocking region is an ion-implanted region.

[Structure 8]

The semiconductor device according to any one of [Structure 1] to [Structure 7], wherein electron trap density in the current blocking region is equal to or greater than $4.0 \times 10^{18}/\text{cm}^3$.

[Structure 9]

The semiconductor device according to any one of [Structure 1] to [Structure 8], wherein the semiconductor device is a transistor.

[Structure 10]

A power converter that uses the semiconductor device according to any one of [Structure 1] to [Structure 9].

[Structure 11]

A control system that uses the semiconductor device according to any one of [Structure 1] to [Structure 9].

A semiconductor device according to the disclosure includes at least: a crystalline oxide semiconductor layer including a channel layer, a drift layer, and a source region; a gate electrode arranged over the channel layer across a gate insulating film; a current blocking region arranged between the channel layer and the drift layer; and a source electrode provided on the source region. The semiconductor device is characterized in that the current blocking region is composed of a high-resistance layer, and the source electrode forms a contact with the current blocking region.

The crystalline oxide semiconductor layer is not particularly limited unless it interferes with the present disclosure. According to an embodiment of the disclosure, the crystalline oxide semiconductor layer preferably contains a crystalline oxide semiconductor as a major component. For example, the crystalline oxide semiconductor is a metal oxide containing one or two or more types of metals selected from aluminum, gallium, indium, iron, chromium, vanadium, titanium, rhodium, nickel, cobalt, and iridium. According to an embodiment of the disclosure, the crystalline oxide semiconductor layer preferably contains at least one type of metal selected from aluminum, indium, and gallium, more preferably, contains at least gallium, most preferably, contains $\alpha\text{-}Ga_2O_3$ or a mixed crystal of $\alpha\text{-}Ga_2O_3$. According to an embodiment of the disclosure, even in a semiconductor device containing a semiconductor of a large bandgap such as gallium oxide or a mixed crystal of gallium oxide, for example, it is still possible to improve an insulation withstand voltage. The crystal structure of the crystalline oxide semiconductor layer is also free from particular limitation unless it interferes with the present disclosure. Examples of the crystal structure of the crystalline oxide semiconductor layer include a corundum structure, a β-Gallia structure, a hexagonal crystal structure (for example, ε-type structure), an orthorhombic crystal structure (for example, κ-type structure), a cubic crystal structure, and a tetragonal crystal structure. According to an embodiment of the disclosure, the crystalline oxide semiconductor layer preferably has a corundum structure, a β-Gallia structure, or a hexagonal crystal structure (for example, ε-type structure), more preferably, has a corundum structure. The term "major component" means that the crystalline oxide semiconductor has a content in terms of an atomic ratio that is equal to or greater than 50% preferably to all components in the crystalline oxide semiconductor layer, means that the content is more preferably equal to or greater than 70%, still more preferably, equal to or greater than 90%, and means that the content may be 100%. If the crystalline oxide semiconductor is gallium oxide, for example, the gallium oxide is simply required to be contained as a crystalline oxide semiconductor in the crystalline oxide semiconductor layer in such a manner that gallium has an atomic ratio that is equal to or greater than 0.5 in all metal elements in the crystalline oxide semiconductor layer. The atomic ratio of gallium in all the metal elements in the crystalline oxide semiconductor layer is preferably equal to or greater than 0.7, more preferably, equal to or greater than 0.9. Furthermore, the thickness of the crystalline oxide semiconductor layer is not particularly limited but may be equal to or less than 1 μm or may be equal to or greater than 1 μm. According to an embodiment of the disclosure, this thickness is preferably equal to or greater than 5 μm, more preferably, equal to or greater than 10 μm. While the surface area of the semiconductor layer (in a plan view) is not particularly limited, it may be equal to or greater than 1 $mm^2$ or equal to or less than 1 $mm^2$. Meanwhile, this surface area is preferably from 10 to 300 $mm^2$, more preferably, from 10 to 100 $mm^2$. Moreover, while the crystalline oxide semiconductor layer is generally a single crystal, it may be a poly crystal. The crystalline oxide semiconductor layer generally includes two or more semiconductor layers. The crystalline oxide semiconductor layer includes at least an $n^+$-type semiconductor layer, a drift layer ($n^-$-type semiconductor layer), a channel layer, and a source region ($n^+$-type semiconductor layer), for example. Furthermore, carrier density in the crystalline oxide semiconductor layer is properly settable by adjusting a doping quantity.

The crystalline oxide semiconductor layer preferably contains a dopant. The dopant is not particularly limited but may be a publicly-known dopant. In particular, according to an embodiment of the disclosure, if the semiconductor layer contains a crystalline oxide containing gallium as a major component, preferred examples of the dopant include n-type dopants such as tin, germanium, silicon, titanium, zirconium, vanadium, and niobium, and p-type dopants such as Mg, H, Li, Na, K, Rb, Cs, Fr, Be, Ca, Sr, Ba, Ra, Mn, Fe, Co, Ni, Pd, Cu, Ag, Au, Zn, Cd, Hg, Ti, Pb, N, and P. According to an embodiment of the disclosure, the n-type dopant is preferably at least one type selected from Sn, Ge, and Si. The content of the dopant is preferably equal to or greater than 0.00001 atomic % in the composition of the semiconductor layer, more preferably, from 0.00001 to 20 atomic %, most preferably, from 0.00001 to 10 atomic %. More specifically, the concentration of the dopant may generally be from $1 \times 10^{16}$ to $1 \times 10^{22}/\text{cm}^3$ approximately. The concentration of the dopant may be set to a low concentration that is equal to or less than $1 \times 10^{17}/\text{cm}^3$ approximately, for example. According to the disclosure, furthermore, the dopant may be contained at a high concentration that is equal to or greater than about $1 \times 10^{20}/cm^3$.

According to an embodiment of the disclosure, the crystalline oxide semiconductor layer includes a channel layer, and a gate electrode is arranged over the channel layer across the gate insulating film. A constituent material for the channel layer may be similar to the constituent material for the crystalline oxide semiconductor layer described above. The conductivity type of the channel layer is also free from particular limitation and may be an n-type or a p-type. If the conductivity type of the channel layer is an n-type, a constituent material for the channel layer is preferably $\alpha$-$Ga_2O_3$ or a mixed crystal of $\alpha$-$Ga_2O_3$, for example. If the conductivity type of the channel layer is a p-type, examples of the constituent material for the channel layer preferably include $\alpha$-$Ga_2O_3$ or a mixed crystal of $\alpha$-$Ga_2O_3$ containing a p-type dopant, a metal oxide containing at least one type of metal selected from Group 6 of the periodic table (for example, $\alpha$-$Cr_2O_3$), and a metal oxide containing at least one type of metal selected from Group 9 of the periodic table (for example, $\alpha$-$Ir_2O_3$, $\alpha$-$Cr_2O_3$, $\alpha$-$Rh_2O_3$). The metal oxide containing at least one type of metal selected from Group 6 of the periodic table or the metal oxide containing at least one type of metal selected from Group 9 of the periodic table may be a mixed crystal with another metal oxide (for example, $Ga_2O_3$).

A constituent material for the gate insulating film (interlayer insulating film) is not particularly limited but may be a publicly-known material. Examples of the material for the gate insulating film include an $SiO_2$ film, a phosphorated $SiO_2$ film (PSG film), a boron-doped $SiO_2$ film, and a phosphorated boron-doped $SiO_2$ film (BPSG film). Examples of a method of forming the gate insulating film include CVD method, atmospheric CVD method, plasma CVD method, and mist CVD method. According to an embodiment of the disclosure, the method of forming the gate insulating film is preferably mist CVD method or atmospheric CVD method. A constituent material for the gate electrode is not particularly limited but may be a publicly-known electrode material. Examples of the constituent material for the gate electrode include the constituent materials for the source electrode described below. A method of forming the gate electrode is not particularly limited. Specific examples of the method of forming the gate electrode include dry method and wet method. Examples of the dry method include sputtering, vacuum evaporation, and CVD. Examples of the wet method include screen printing and die coating.

A constituent material for the drift layer may be the constituent material for the crystalline oxide semiconductor layer described above, for example. According to an embodiment of the disclosure, the drift layer preferably contains a crystalline oxide semiconductor as a major component. Preferably, the crystalline oxide semiconductor contains at least one type of metal selected from aluminum, indium, and gallium, more preferably, contains at least gallium, most preferably, contains $\alpha$-$Ga_2O_3$ or a mixed crystal of $\alpha$-$Ga_2O_3$.

The current blocking region is not particularly limited as long as it is composed of a high-resistance layer and is provided between the channel layer and the drift layer in the semiconductor device. A resistance in the high-resistance layer is not particularly limited unless it interferes with the present disclosure. According to an embodiment of the disclosure, the high-resistance layer has a resistance that is generally equal to or greater than $1.0 \times 10^6$ $\Omega \cdot cm$. According to an embodiment of the disclosure, the resistance in the high-resistance layer is preferably equal to or greater than $1.0 \times 10^{10}$ $\Omega \cdot cm$, more preferably, the resistance in the high-resistance layer is equal to or greater than $1.0 \times 10^{12}$ $\Omega \cdot cm$. This resistance may be measured by forming an electrode for measurement in the high-resistance layer and causing a current to flow therein. An upper limit of the resistance is not particularly limited. The upper limit of the resistance is preferably equal to or greater than $1.0 \times 10^{15}$ $\Omega \cdot cm$, more preferably, $1.0 \times 10^{14}$ $\Omega \cdot cm$. According to an embodiment of the disclosure, the current blocking region may be provided in the drift layer or on the drift layer. According to an embodiment of the disclosure, the current blocking region also preferably contains a dopant. The dopant is not particularly limited unless it interferes with the present disclosure. Examples of the dopant include Sn, Ge, Si, Ti, Zr, V, Nb, Mg, H, Li, Na, K, Rb, Cs, Fr, Be, Ca, Sr, Ba, Ra, Mn, Fe, Co, Ni, Pd, Cu, Ag, Au, Zn, Cd, Hg, Ti, Pb, Al and N. The concentration of the dopant in the current blocking region is preferably equal to or greater than $1.0 \times 10^{17}/cm^3$, more preferably, equal to or greater than $5.0 \times 10^{17}/cm^3$. According to an embodiment of the disclosure, it is also preferable that the current blocking region be an ion-implanted region. A profile of the ion implantation is not particularly limited. According to an embodiment of the disclosure, the ion implantation is preferably performed in such a manner as to provide a box profile. Such a preferred configuration makes it possible to reduce a leakage current further in the current blocking region. An element implanted in the ion implantation is not particularly limited. Examples of the element implanted in the ion implantation include Sn, Ge, Si, Ti, Zr, V, Nb, Mg, H, Li, Na, K, Rb, Cs, Fr, Be, Ca, Sr, Ba, Ra, Mn, Fe, Co, Ni, Pd, Cu, Ag, Au, Zn, Cd, Hg, Ti, Pb, Al and N. The concentration of the element implanted into the current blocking region by the ion implantation is not particularly limited. According to an embodiment of the disclosure, the concentration of the element implanted into the crystal defect region by the ion implantation is preferably equal to or greater than $1.0 \times 10^{17}/cm^3$.

The source region is not particularly limited as long as it includes an $n^+$-type semiconductor layer. According to an embodiment of the disclosure, the source region preferably includes at least an $n^+$-type semiconductor layer, and an $n^{++}$-type semiconductor layer arranged on the $n^+$-type semiconductor layer and having larger carrier density than the $n^+$-type semiconductor layer. The carrier density is obtainable through a publicly-known method. Examples of the method of obtaining the carrier density include SIMS (secondary ion mass spectrometry), SMC (scanning capacitance microscopy), SMM (scanning microwave microscopy), and SRA (spreading resistance analysis). A major component in the $n^+$-type semiconductor layer and a major component in the $n^{++}$-type semiconductor layer may be the same or different from each other. According to an embodiment of the disclosure, the major component in the $n^+$-type semiconductor layer and the major component in the $n^{++}$-type semiconductor layer are preferably the same. According to an embodiment of the disclosure, the $n^+$-type semiconductor layer and the $n^{++}$-type semiconductor layer preferably have the same crystal structure, more preferably, the $n^+$-type semiconductor layer and the $n^{++}$-type semiconductor layer have a corundum structure. If the major component in the $n^+$-type semiconductor layer is gallium oxide, for example, the term "major component" mentioned herein means that gallium is simply required to have a content in terms of an atomic ratio that is equal to or greater than 50% in all metal elements in the $n^+$-type semiconductor layer. According to an embodiment of the disclosure, gallium has an atomic ratio in all the metal elements in the $n^+$-type semiconductor layer that is preferably equal to or greater than 70%, more preferably, equal to or greater than 90%, and may be 100%. According to an embodiment of the disclosure, the $n^{++}$-type semiconductor layer is preferably an epitaxial layer, and the $n^{++}$-type semiconductor layer is more preferably epitaxially doped. Using this preferred $n^{++}$-type semiconductor layer makes it possible to reduce a contact resistance more favorably. The epitaxial doping mentioned herein means not doping through ion implantation, for example, but doping through epitaxial growth. An n-type dopant contained in the $n^+$-type semiconductor layer and/or the $n^{++}$-type semiconductor layer is at least one type of n-type dopant selected from tin, germanium, silicon, titanium, zirconium, vanadium, and niobium, for example. According to an embodiment of the disclosure, the n-type dopant is preferably at least one type selected from Sn, Ge, and Si. Carrier density in the $n^{++}$-type semiconductor layer is not particularly limited as long as it is larger than carrier density in the $n^+$-type semiconductor layer. According to an embodiment of the disclosure, the carrier density in the $n^{++}$-type semiconductor layer is preferably equal to or greater than $1.0 \times 10^{19}/cm^3$, more preferably, equal to or greater than $6.0 \times 10^{19}/cm^3$. Setting the carrier density in the $n^{++}$-type semiconductor layer to such a preferred value makes it possible to reduce a contact resistance more favorably. The carrier density in the $n^+$-type semiconductor layer is also free from particular limitation. According to an embodiment of the disclosure, the carrier density in the $n^+$-type semiconductor layer is preferably within a range equal to or greater than $1.0 \times 10^{17}/cm^3$ and less than $1.0 \times 10^{19}/cm^3$. Setting the carrier density in the $n^+$-type semiconductor layer within such a preferred range makes it possible to reduce a source resistance more favorably. According to an embodiment of the disclosure, a method of doping the $n^+$-type semiconductor layer is not particularly limited but may be diffusion or ion implantation, or may be an epitaxial growth method. According to an embodiment of the disclosure, mobility in the $n^+$-type semiconductor layer is preferably greater than mobility in the $n^{++}$-type semiconductor layer. The thickness of the $n^{++}$-type semiconductor layer is not particularly limited unless it interferes with the present disclosure. According to an embodiment of the disclosure, the thickness of the $n^{++}$-type semiconductor layer is preferably within a range from 1 nm to 1 μm, more preferably, within a range from 10 nm to 100 nm. According to an embodiment of the disclosure, the thickness of the $n^+$-type semiconductor layer is preferably larger than that of the $n^{++}$-type semiconductor layer. Using the preferred combination of the $n^+$-type semiconductor layer and the $n^{++}$-type semiconductor layer described above makes it possible to reduce a source contact resistance and a source resistance in the semiconductor more favorably, thereby achieving the semiconductor device where an element resistance is reduced further.

The source electrode is not particularly limited as long as it has conductive properties and unless it interferes with the present disclosure. A constituent material for the source electrode may be a conductive inorganic material or a conductive organic material. According to an embodiment of the disclosure, the material for the source electrode is preferably metal. Preferably, the metal is at least one type of metal selected from Group 4 to Group 10 of the periodic table, for example. Examples of a metal in Group 4 of the periodic table include titanium (Ti), zirconium (Zr), and hafnium (Hf). Examples of a metal in Group 5 of the periodic table include vanadium (V), niobium (Nb), and tantalum (Ta). Examples of a metal in Group 6 of the periodic table include chromium (Cr), molybdenum (Mo), and tungsten (W). Examples of a metal in Group 7 of the periodic table include manganese (Mn), technetium (Tc), and rhenium (Re). Examples of a metal in Group 8 of the periodic table include iron (Fe), ruthenium (Ru), and osmium (Os). Examples of a metal in Group 9 of the periodic table include cobalt (Co), rhodium (Rh), and iridium (Ir). Examples of a metal in Group 10 of the periodic table include nickel (Ni), palladium (Pd), and platinum (Pt). According to an embodiment of the disclosure, the source electrode preferably contains at least one type of metal selected from titanium (Ti), tantalum (Ta), and tungsten (W). According to an embodiment of the disclosure, the source electrode may contain a conductive metal oxide. Examples of the conductive metal oxide contained in the source electrode include metal oxide conductive films such as tin oxide, zinc oxide, indium oxide, indium tin oxide (ITO), and indium zinc oxide (IZO). The source electrode may be configured as a single layer or may have a plurality of metal layers. If the source electrode has a plurality of metal layers, it is preferable that a metal in Group 4 of the periodic table be used in a first layer and a third layer, and a metal in Group 13 of the periodic table (such as Al, for example) be used in a second layer between the first layer and the third layer. Using the source electrode having such a preferred configuration makes it possible to improve reliability of ohmic characteristics further between the source electrode and a source region. A method of forming the source electrode is not particularly limited. Specific examples of the method of forming the source electrode include dry method and wet method. Examples of the dry method include sputtering, vacuum evaporation, and CVD. Examples of the wet method include screen printing and die coating.

According to an embodiment of the disclosure, the source electrode forms a contact with the current blocking region. The source electrode may form a contact with the current blocking region across a different layer such as an $n^+$-type semiconductor layer, for example. According to an embodiment of the disclosure, the source electrode more preferably forms a contact with the current blocking region directly. Such a preferred configuration makes it possible to improve the responsiveness of the semiconductor device further.

Figure 6:
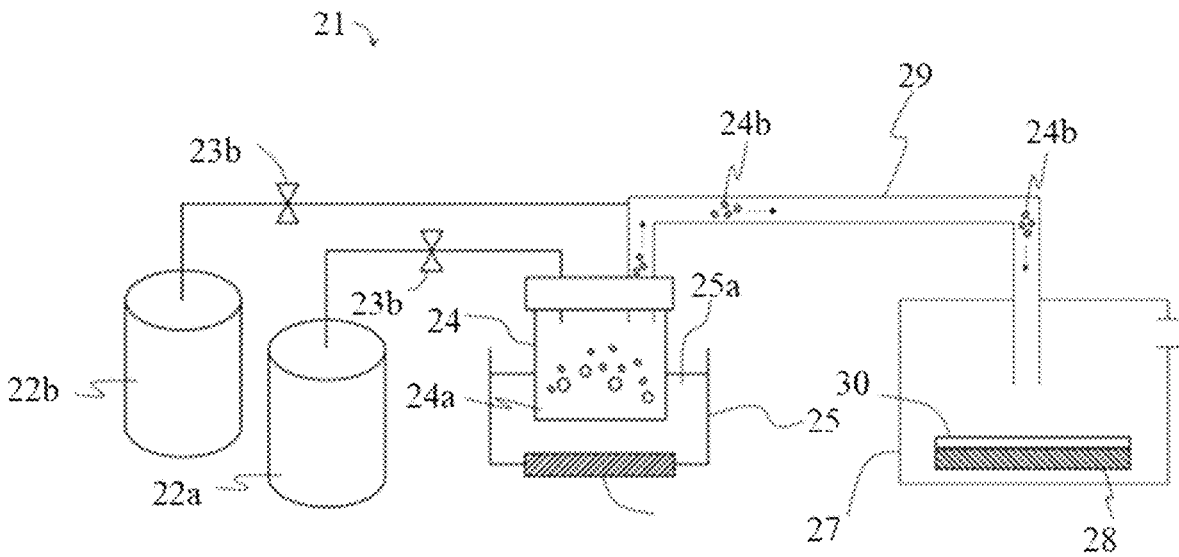
FIG. 6 is a configuration view of a mist CVD device that is used in an embodiment of the disclosure.

The crystalline oxide semiconductor layer (hereinafter also called "oxide semiconductor layer," "semiconductor film," or "semiconductor layer") may be formed using publicly-known means. Examples of the means of forming the semiconductor layer include CVD method, MOCVD method, MOVPE method, mist CVD method, mist epitaxy method, MBE method, HVPE method, pulse growth method, and ALD method. According to an embodiment of the disclosure, the means of forming the semiconductor layer is preferably MOCVD method, mist CVD method, mist epitaxy method, or HVPE method, and preferably mist CVD method or mist epitaxy method. According to the mist CVD method or the mist epitaxy method, using a mist CVD device illustrated in FIG. 6, for example, a raw material solution is atomized (atomization step), droplets are caused to float, resultant atomized droplets are carried onto a base with a carrier gas after the atomization (carrying step), and then a thermal reaction of the atomized droplets is generated in the vicinity of the base to deposit a semiconductor film containing a crystalline oxide semiconductor as a major component on the base (deposition step), thereby forming the semiconductor layer.

(Atomization Step)

At the atomization step, the raw material solution is atomized. Means of atomizing the raw material solution is not particularly limited but may be publicly-known means as long as it is available for atomization of the raw material solution. According to an embodiment of the disclosure, atomization means using ultrasonic waves is preferred. The atomized droplets obtained by using ultrasonic waves are preferred as they have a zero initial velocity and float in air. These atomized droplets are free from damage due to collision energy, so they are considerably preferred as they are a mist that floats in space and carriable as a gas, not to be blown like a spray, for example. The droplet size is not particularly limited but the droplets may be droplets of several millimeters. Preferably, the droplet size is equal to or less than 50 μm, more preferably, from 100 nm to 10 μm.

(Raw Material Solution)

The raw material solution is not particularly limited as long as it contains a raw material capable of being atomized or formed into droplets and available for forming a semiconductor film, and may be an inorganic material or an organic material. According to an embodiment of the disclosure, the raw material is preferably metal or a metal compound, more preferably, contains one or two or more types of metals selected from aluminum, gallium, indium, iron, chromium, vanadium, titanium, rhodium, nickel, cobalt, and iridium.

According to an embodiment of the disclosure, a solution containing the metal, in a form of complex or salt, dissolved or dispersed in an organic solvent or water may be used preferably as the raw material solution. Examples of the form of the complex include an acetylacetonate complex, a carbonyl complex, an ammine complex, and a hydride complex. Examples of the form of the salt include an organic metal salt (e.g., metal acetate, metal oxalate, metal citrate, etc.), metal sulfide, metal nitrate, phosphorylated metal, and metal halide (e.g., metal chloride, metal bromide, metal iodide, etc.).

Preferably, the raw material solution contains a mixed additive such as hydrohalic acid or an oxidant. Examples of the hydrohalic acid include hydrobromic acid, hydrochloric acid, and hydroiodic acid. In particular, hydrobromic acid or hydroiodic acid is preferred as they are being capable of reducing the occurrence of an abnormal particle more efficiently. Examples of the oxidant include peroxides such as hydrogen peroxide ($H_2O_2$), sodium peroxide ($Na_2O_2$), barium peroxide ($BaO_2$), and benzoyl peroxide ($C_6H_5CO)_2$ $O_2$, hypochlorous acid ($HClO$), perchloric acid, nitric acid, ozone water, and organic peroxides such as peracetic acid and nitrobenzene.

The raw material solution may contain a dopant. Incorporating the dopant into the raw material solution makes it possible to perform doping favorably. The dopant is not particularly limited unless it interferes with the present disclosure. Examples of the dopant include n-type dopants such as tin, germanium, silicon, titanium, zirconium, vanadium and niobium, and p-type dopants such as Mg, H, Li, Na, K, Rb, Cs, Fr, Be, Ca, Sr, Ba, Ra, Mn, Fe, Co, Ni, Pd, Cu, Ag, Au, Zn, Cd, Hg, Ti, Pb, N, and P. The content of the dopant is set appropriately using a calibration curve indicating a relationship of the concentration of the dopant in the raw material with intended carrier density.

A solvent of the raw material solution is not particularly limited but may be an inorganic solvent such as water, an organic solvent such as alcohol, or a mixed solvent of the inorganic solvent and the organic solvent. According to an embodiment of the disclosure, the solvent preferably includes water, more preferably, is water or a mixed solvent of water and alcohol.

(Carrying Step)

At the carrying step, the atomized droplets are carried into a deposition chamber by using a carrier gas. The carrier gas is not particularly limited unless it interferes with the disclosure. Preferred examples of the carrier gas include oxygen, ozone, inert gases such as nitrogen and argon, and reduction gases such as hydrogen gas and forming gas. Furthermore, the carrier gas may have one or two or more types. A diluted gas (e.g., 10-fold diluted gas) and the like reduced in flow rate may be further used as a second carrier gas. A location for supplying the carrier gas is not limited to one but the carrier gas may be supplied from two or more locations. While the flow rate of the carrier gas is not particularly limited, it is preferably from 0.01 to 20 L/min., more preferably, from 1 to 10 L/min. In the case of a diluted gas, the flow rate of the diluted gas is preferably from 0.001 to 2 L/min., more preferably, from 0.1 to 1 L/min.

(Deposition Step)

At the deposition step, a thermal reaction of the atomized droplets is generated in the vicinity of the base to deposit the semiconductor film on the base. The thermal reaction is simply required to be a reaction of the atomized droplets generated using heat. Conditions, etc. for the reaction are also free from particular limitation unless they interfere with the present disclosure. At this step, the thermal reaction is generally generated at a temperature equal to or higher than an evaporation temperature of a solvent. Preferably, this temperature does not exceed an excessively high temperature (1000° C., for example) and more preferably, it is equal to or less than 650° C., most preferably, from 300 to 650° C. The thermal reaction may be generated in any of atmospheres including vacuum, non-oxygen atmosphere (such as inert gas atmosphere, for example), reducing gas atmosphere, and oxygen atmosphere unless they interfere with the present disclosure. Preferably, the thermal reaction is generated under inert gas atmosphere or oxygen atmosphere. Furthermore, the thermal reaction may be generated under any of conditions including atmospheric pressure, increased pressure, and reduced pressure. According to an embodiment of the disclosure, the thermal reaction is preferably generated under atmospheric pressure. A thickness is settable through adjustment of a period of the deposition.

(Base)

The base is not particularly limited as long as it is available for supporting the semiconductor film. A material for the base is also free from particular limitation and the base may be a publicly-known base unless it interferes with the present disclosure. The material may be an organic compound or an inorganic compound. Any shape is applicable as the shape of the base. The base is effective for every type of shape. Examples of the shape include plate-like shapes such as flat plates and circular plates, fibrous shapes, rod shapes, circular columnar shapes, prism shapes, tubular shapes, spiral shapes, spherical shapes, and ring shapes. According to an embodiment of the disclosure, a substrate is preferred. According to an embodiment of the disclosure, the thickness of the substrate is not particularly limited.

The substrate is not particularly limited as long as it has a plate-like shape and functions as a support for the semiconductor film. While the substrate may be an insulator substrate, a semiconductor substrate, a metal substrate, or a conductive substrate, the substrate is preferably an insulator substrate or is also preferably a substrate with a metal film formed on its surface. Examples of the substrate include a base substrate containing a substrate material having a corundum structure as a major component, a base substrate containing a substrate material having a β-Gallia structure as a major component, and a base substrate containing a substrate material having a hexagonal crystal structure as a major component. The term "major component" herein means that the substrate material having the above-described specific crystal structure has a content in terms of an atomic ratio that is equal to or greater than 50% preferably to all components in the substrate material, means that the content is more preferably equal to or greater than 70%, still more preferably, equal to or greater than 90%, and may be 100%.

The substrate material is not particularly limited but may be a publicly-known material unless it interferes with the present disclosure. Preferred examples of the above-described substrate material having a corundum structure include $\alpha$-$Al_2O_3$ (sapphire substrate) and $\alpha$-$Ga_2O_3$. More preferred examples thereof include an a-plane sapphire substrate, an m-plane sapphire substrate, an r-plane sapphire substrate, a c-plane sapphire substrate, and an $\alpha$-type gallium oxide substrate (a-plane, m-plane, or r-plane). Examples of the base substrate containing the substrate material having a $\beta$-Gallia structure as a major component include a $\beta$-$Ga_2O_3$ substrate and a mixed crystal substrate containing $Ga_2O_3$ and $Al_2O_3$ in which $Al_2O_3$ is greater than 0 wt % and equal to or less than 60 wt %. Examples of the base substrate containing the substrate material having a hexagonal crystal structure as a major component include an SiC substrate, a ZnO substrate, and a GaN substrate.

According to an embodiment of the disclosure, annealing process may be performed after the deposition step. A processing temperature of the annealing is not particularly limited unless it interferes with the present disclosure. This temperature is generally from 300 to 650° C., preferably, from 350 to 550° C. A processing period of the annealing is generally from 1 minute to 48 hours, preferably, from 10 minutes to 24 hours, more preferably, from 30 minutes to 12 hours. The annealing process may be performed in any atmosphere unless it interferes with the present disclosure. The annealing process may be performed in non-oxygen atmosphere or oxygen atmosphere. Examples of the non-oxygen atmosphere include inert gas atmosphere (for example, nitrogen atmosphere) and reducing gas atmosphere. According to an embodiment of the disclosure, inert gas atmosphere is preferred and nitrogen atmosphere is more preferred.

According to an embodiment of the disclosure, the semiconductor film may be provided directly on the base. Alternatively, the semiconductor film may be provided across a different layer such as a stress relaxing layer (such as a buffer layer or an ELO layer, for example) or a separation sacrificial layer. Means of forming each layer is not particularly limited but may be publicly-known means. According to an embodiment of the disclosure, mist CVD method is preferred.

According to an embodiment of the disclosure, the semiconductor film may be subjected to publicly-known means such as separation from the base, etc., and then may be used as the semiconductor layer in a semiconductor device. Alternatively, the semiconductor film may be used as it is as the semiconductor layer in a semiconductor device.

The semiconductor device according to the disclosure is useful for various semiconductor elements, particularly for power devices. The semiconductor element is categorizable into a lateral element (lateral device) where an electrode is formed on one side of a semiconductor layer and a current flows in a direction vertical to a thickness direction of the semiconductor layer, and a vertical element (vertical device) where an electrode is provided on each of a front side and a back side of a semiconductor layer and a current flows in a thickness direction of the semiconductor layer. According to an embodiment of the disclosure, the semiconductor element is used preferably both as the lateral device and the vertical device. In particular, the semiconductor element is used preferably as the vertical device. Examples of the semiconductor element include a metal-semiconductor field-effect transistor (MESFET), a high-electron-mobility transistor (HEMT), a metal-oxide-semiconductor field-effect transistor (MOSFET), a static induction transistor (SIT), a junction field-effect transistor (JFEET), and an insulated gate bipolar transistor (IGBT). According to an embodiment of the disclosure, the semiconductor device is preferably a MOSFET, an SIT, a JFET, or an IGBT, more preferably, a MOSFET or an IGBT.

Preferred examples of the semiconductor device will be described below using the drawings. However, the disclosure is not to be limited to these embodiments. Semiconductor devices described below as examples may include additional different layers (such as insulator layers, semi-insulator layers, conductor layers, semiconductor layers, buffering layers, or other intermediate layers), or buffering layers (buffer layers) may be omitted, if appropriate, unless they interfere with the present disclosure.

Figure 4:
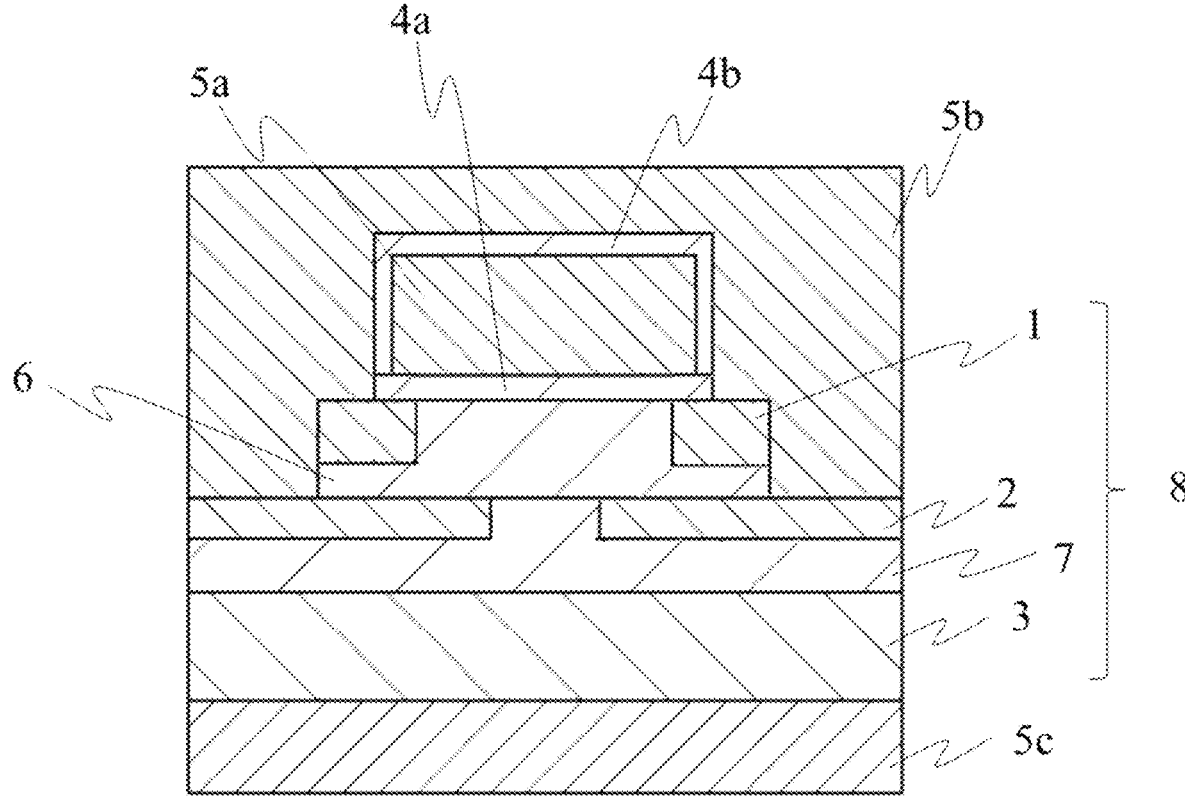
FIG. 4 is a view schematically illustrating a metal-oxide-semiconductor field-effect transistor (MOSFET) according to an embodiment of the disclosure.
Figure 11:
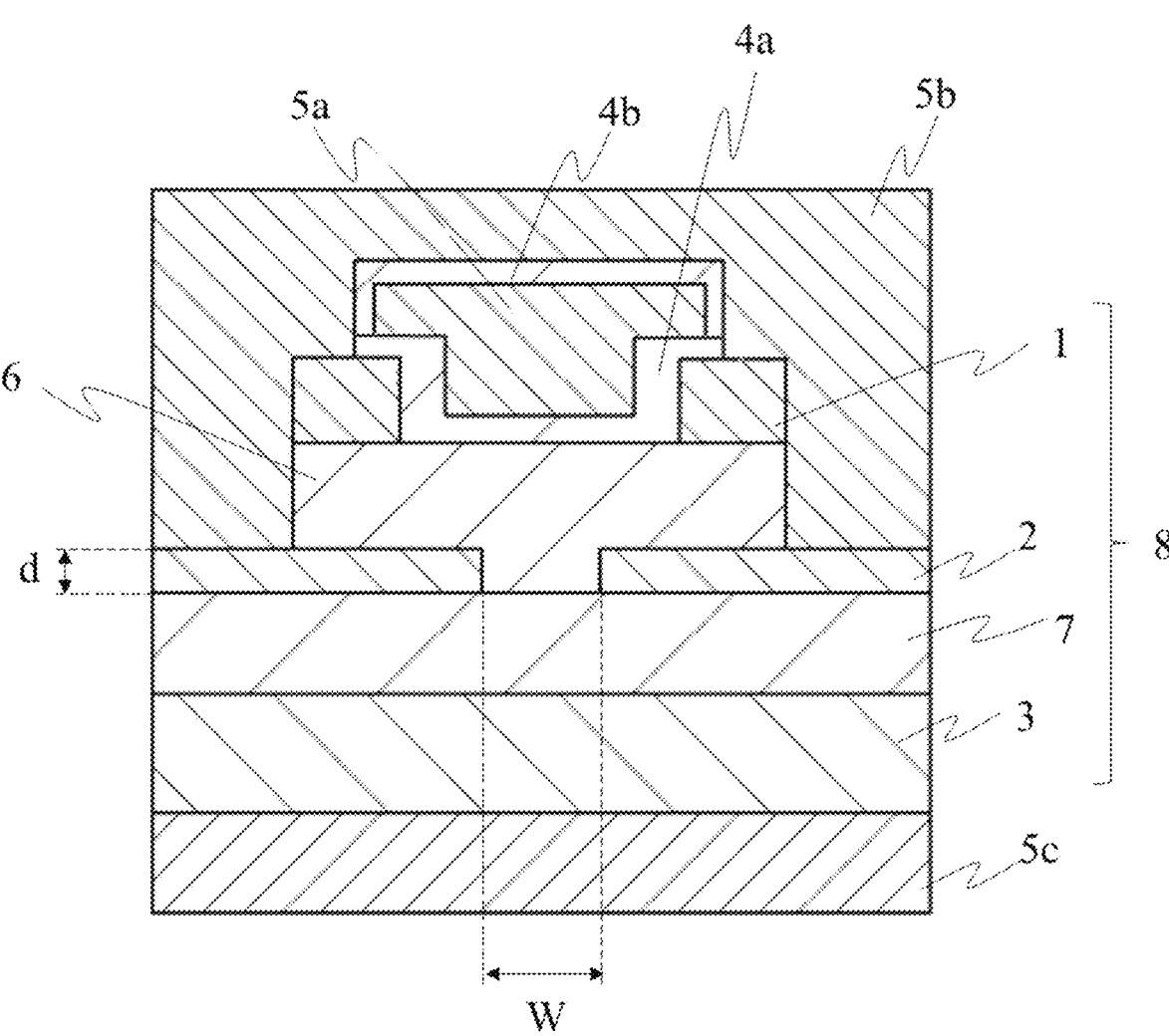
FIG. 11 is a view schematically illustrating a metal-oxide-semiconductor field-effect transistor (MOSFET) according to an embodiment of the disclosure.

FIG. 1 illustrates a principal part of a metal-oxide-semiconductor field-effect transistor (MOSFET) according to one preferred embodiment of the disclosure. The MOSFET in FIG. 1 includes a drain electrode 5c, an $n^+$-type semiconductor layer 3, an $n^-$-type semiconductor layer 7 as a drift layer, a high-resistance layer (current blocking region) 2, a channel layer 6, a source region ($n^+$-type semiconductor layer) 1, a gate insulating film 4a, a gate electrode 5a, and a source electrode 5b. As clearly understood from FIG. 1, in the MOSFET in FIG. 1, the $n^+$-type semiconductor layer 3, the $n^-$-type semiconductor layer (drift layer) 7, the current blocking layer 2, the channel layer 6, and the $n^+$-type semiconductor layer (source layer) 1 are formed in this order over the drain electrode 5c. Here, the $n^+$-type semiconductor layer 3, the $n^-$-type semiconductor layer 7, the channel layer 6, the current blocking layer 2, and the $n^+$-type semiconductor layer 1 form a crystalline oxide semiconductor layer 8. The high-resistance layer (current blocking region) 2 is a layer formed through ion implantation and including crystal defect resulting from the ion implantation. When the MOSFET in FIG. 1 is in an on state, by applying a voltage between the source electrode 5b and the drain electrode 5c and applying a voltage to the gate electrode 5a that is positive relative to the source electrode 5b, electrons (holes) are injected into the channel layer 6 to turn on the MOSFET. For an off state, a voltage at the gate electrode is brought to 0 V to fill the channel layer 6 with a depletion layer, thereby turning off the MOSFET. According to an embodiment of the disclosure, using this high-resistance layer (current blocking region) makes it possible to improve withstand voltage performance further while maintaining the MOSFET operation of the semiconductor device. The source electrode 5b directly forms a contact with the high-resistance layer (current blocking region) 2. With this configuration, electrons are transferred favorably between the source electrode and the high-resistance layer (current blocking region) 2, making it possible to improve the responsiveness of the semiconductor device (MOSFET) further. The current blocking layer overlaps the source electrode in a plan view and overlaps a part of the channel layer in a plan view as viewed in a thickness direction of the crystalline oxide semiconductor layer 8. The current blocking layer is configured not to overlap a part of the channel layer as viewed in the thickness direction of the crystalline oxide semiconductor layer 8. With this configuration, a current path is ensured while current blocking effect is maintained. A width W of the current path is not particularly limited unless it interferes with the present disclosure. In particular, according to an embodiment of the disclosure, if a material of a large bandgap such as gallium oxide is used in the drift layer, the width W of the current path is preferably equal to or less than 2 µm. A thickness d of the current blocking layer is also free from particular limitation unless it interferes with the present disclosure. In particular, according to an embodiment of the disclosure, if a material of a large bandgap such as gallium oxide is used in the drift layer, the thickness d of the current blocking layer is preferably equal to or greater than 0.15 µm, more preferably, equal to or greater than 0.2 µm. According to another preferred embodiment, in the semiconductor device in FIG. 1, the source region (n$^+$-type semiconductor layer) 1 may be buried at least partially in the channel layer 6. FIG. 4 illustrates an example of a case where the source region (n$^+$-type semiconductor layer) 1 is buried in the channel layer 6. In the configuration illustrated in FIG. 4, electric field concentration of an electric field applied to the gate insulating film is unlikely to occur, making it possible to improve the reliability of the gate insulating film further. FIG. 11 illustrates a principal part of a metal-oxide-semiconductor field-effect transistor (MOSFET) according to one preferred embodiment of the disclosure. The MOSFET in FIG. 11 differs from the MOSFET in FIG. 1 in that a high-resistance layer (current blocking region) is provided on the drift layer 7 through epitaxial growth.

Means of forming each layer in FIGS. 1, 4, and 11 is not particularly limited but may be publicly-known means unless it interferes with the present disclosure. Examples of the means include means of performing patterning using photolithography method after deposition through vacuum evaporation method, CVD method, sputtering method, or various types of coating technology, and means of performing patterning directly using technology such as printing.

Figure 2:
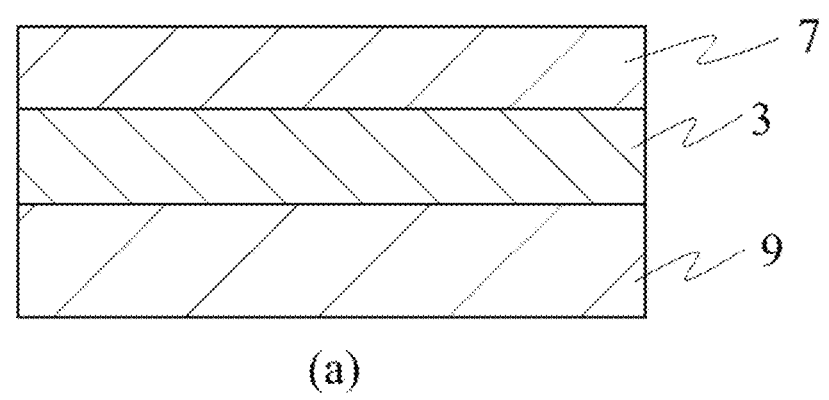
FIG. 2 is a view schematically illustrating a preferred step of manufacturing a metal-oxide-semiconductor field-effect transistor (MOSFET) according to an embodiment of the disclosure.
Figure 2:
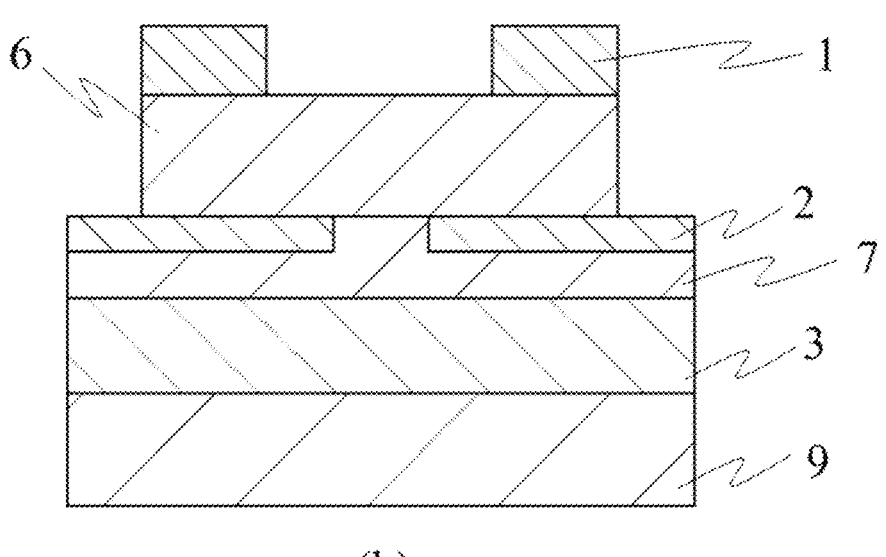
Figure 2:
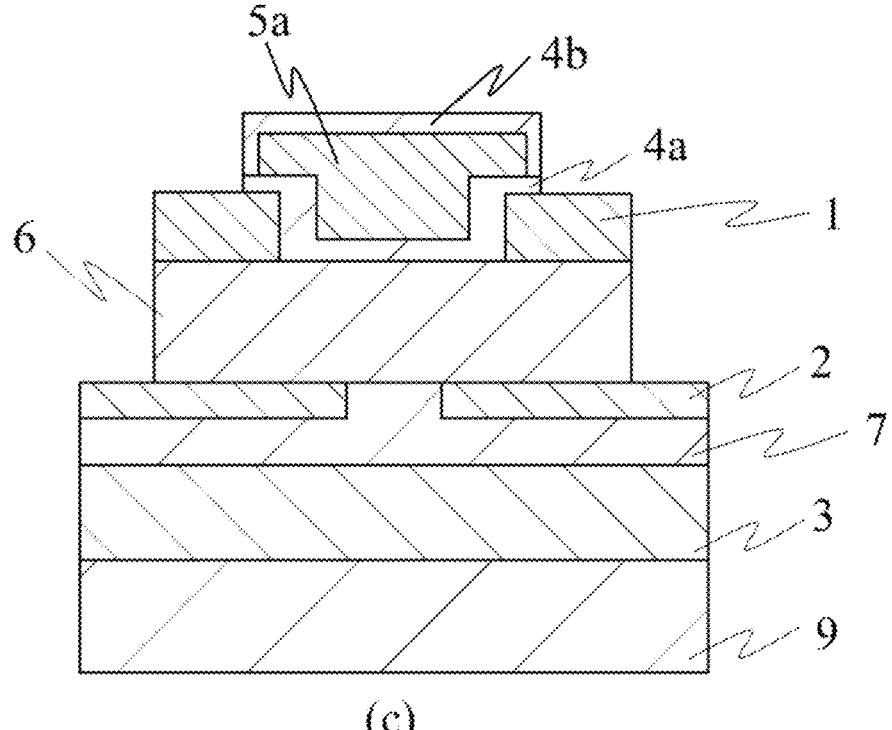

The disclosure will be described in more detail using a preferred example of manufacturing the semiconductor device in FIG. 1. FIG. 2(a) illustrates a multilayer structure where the n$^+$-type semiconductor layer 3 and the drift layer (n$^-$-type semiconductor layer) 7 are stacked in this order over a substrate 9. The current blocking layer (crystal defect region) 2 is formed in the drift layer (n$^-$-type semiconductor layer) of the multilayer structure in FIG. 2(a) using ion implantation and then the channel layer 6 and the n$^+$-type semiconductor layer 1 as a source region are formed, thereby providing a multilayer structure in FIG. 2(b). Implantation energy for the ion implantation is not particularly limited. According to an embodiment of the disclosure, the implantation energy for the ion implantation is in a range from 10 to 500 keV, for example. The n$^+$-type semiconductor layer 1 is formed into a pattern by depositing a film using epitaxial growth method such as mist CVD method and then performing etching using publicly-known etching technology, for example. Next, the gate insulating film 4a and the gate electrode 5a are formed over the multilayer structure in FIG. 2(b), thereby providing a multilayer structure in FIG. 2(c). Each of the gate insulating film 4a and the gate electrode 5a may be processed into the shape illustrated in FIG. 2(c) by depositing a film using a publicly-known deposition method and then performing etching using publicly-known etching technology.

Figure 3:
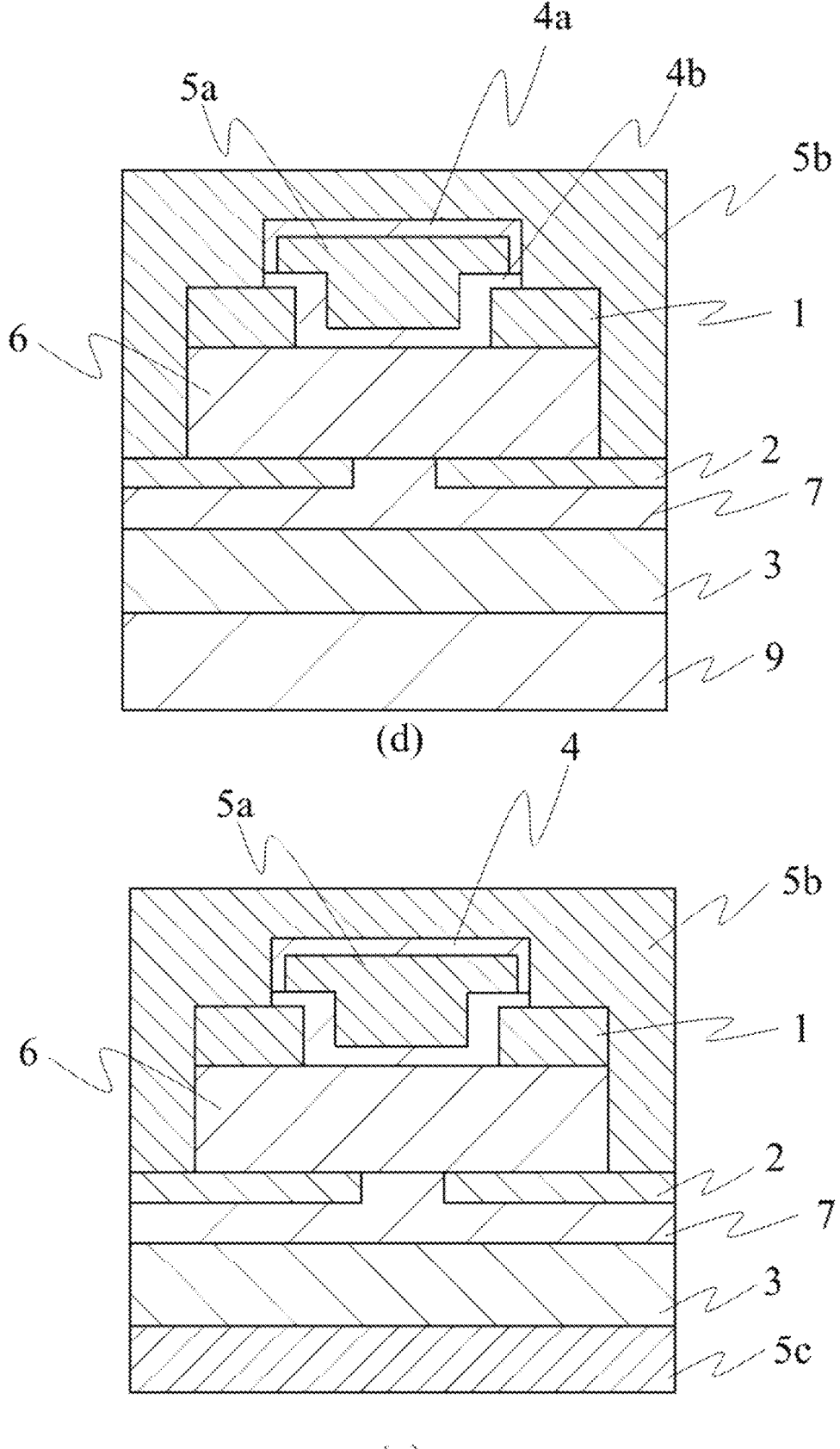
FIG. 3 is a view schematically illustrating a preferred step of manufacturing a metal-oxide-semiconductor field-effect transistor (MOSFET) according to an embodiment of the disclosure.

Next, the source electrode 5b is formed on the multilayer structure in FIG. 2(c) using a publicly-known deposition method to provide a multilayer structure in FIG. 3(d). A method of depositing the source electrode 5b may be the dry method or the wet method described above. Next, the substrate 9 is removed from the multilayer structure in FIG. 3(d) and then the drain electrode 5c is formed using a publicly-known deposition method, thereby providing a semiconductor device in FIG. 3(e). The semiconductor device in FIG. 3(e) includes the current blocking region composed of the crystal defect region as described above. This achieves more excellent withstand voltage performance while maintaining MOSFET operation (normally-off operation).

Figure 5:
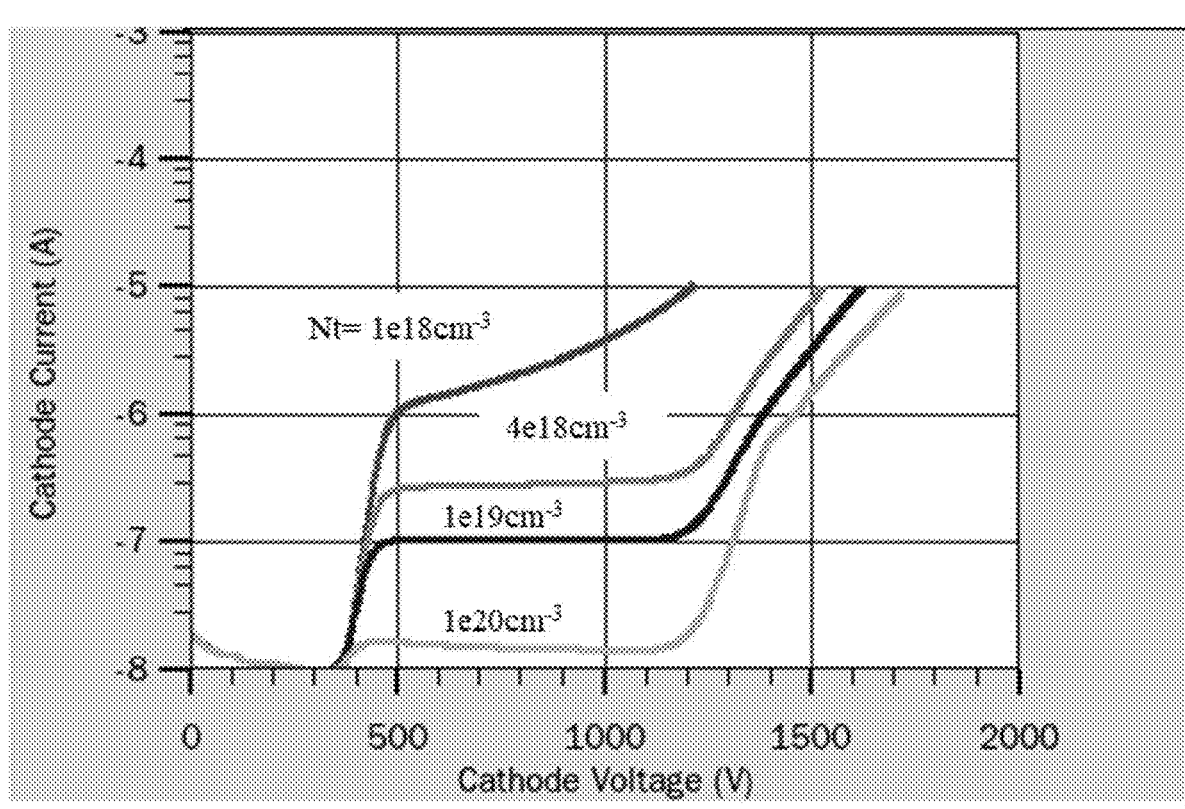
FIG. 5 is a view illustrating simulation results according to an embodiment of the disclosure.

The effect of improving withstand voltage performance achieved by electron trap density in the current blocking region according to the disclosure was verified using device simulation. Results thereof are illustrated in FIG. 5. As clearly understood from FIG. 5, the electron trap density in the current blocking region is preferably equal to or greater than $4 \times 10^{18}$/cm$^3$. Setting such a preferred range makes it possible to further encourage the effect of improving a withstand voltage achieved by the electron blocking region. The trap density is measurable using DLTS (deep level transient spectroscopy) method, for example.

Figure 7:
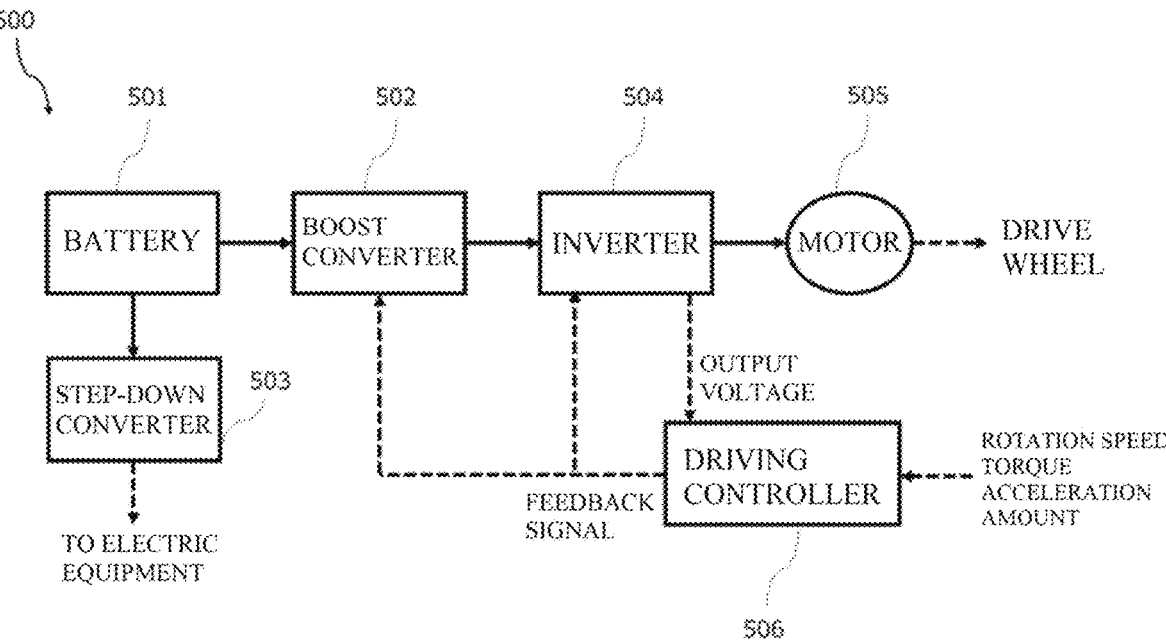
FIG. 7 is a block configuration view illustrating an example of a control system that uses a semiconductor device according to an embodiment of the disclosure.
Figure 8:
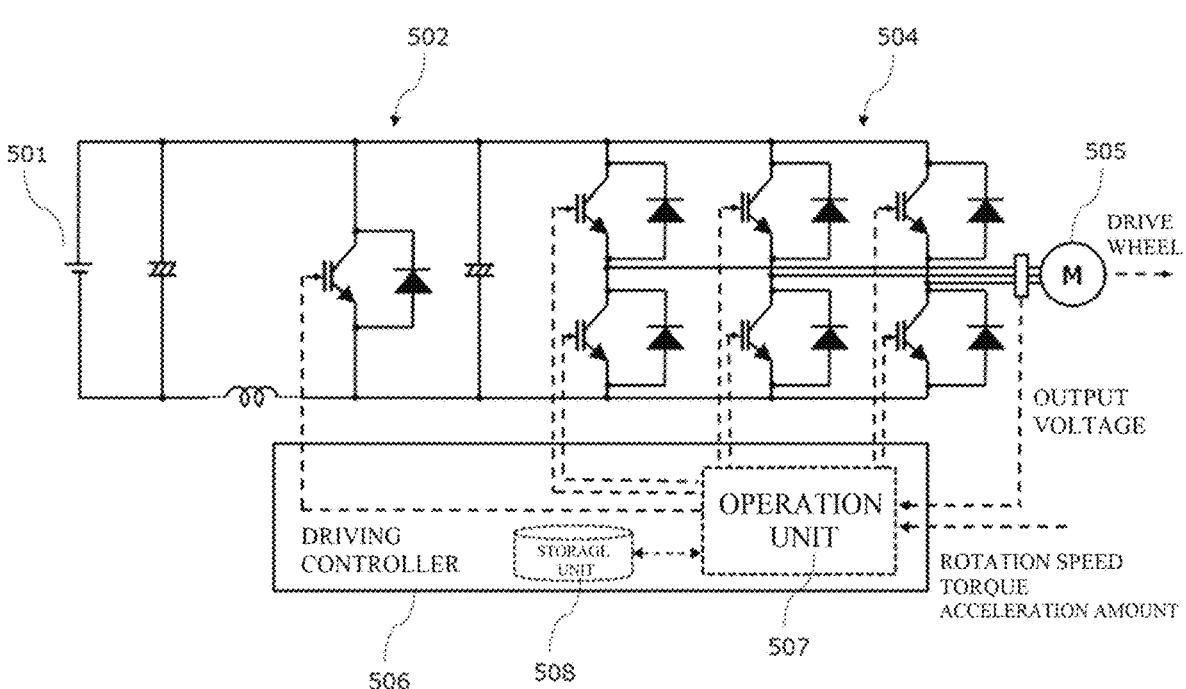
FIG. 8 is a circuit diagram illustrating an example of a control system that uses a semiconductor device according to an embodiment of the disclosure.

The semiconductor device described above according to an embodiment of the disclosure is applicable to a power converter such as an inverter or a converter in order to fulfill the foregoing function. More specifically, the semiconductor device is applicable as a thyristor, a power transistor, an IGBT (insulated gate bipolar transistor), or an MOSFET (metal-oxide-semiconductor field effect transistor) as a switching element, for example. FIG. 7 is a block configuration view illustrating an example of a control system that uses a semiconductor device according to an embodiment of the disclosure. FIG. 8 is a circuit diagram of this control system. This control system is suitable particularly for mounting on an electric vehicle.

As illustrated in FIG. 7, a control system 500 has a battery (power supply) 501, a boost converter 502, a step-down converter 503, an inverter 504, a motor (driving target) 505, and a driving controller 506. These devices are mounted on an electric vehicle. The battery 501 is composed of a storage battery such as a nickel hydrogen battery or a lithium ion battery, for example, and capable of storing power by being charged at a charging station or using regenerative energy generated during deceleration and outputting a direct-current voltage required for operation of a traveling system or an electric component system of the electric vehicle. The boost converter 502 is a voltage converter equipped with a chopper circuit, for example, and is capable of boosting a direct-current voltage such as 200 V, for example, supplied from the battery 501 to 650 V, for example, through switching operation of the chopper circuit, and outputting the resultant voltage to a traveling system such as a motor. The step-down converter 503 is also a voltage converter equipped with a chopper circuit. The step-down converter 503 is capable of stepping down a direct-current voltage such as 200 V, for example, supplied from the battery 501 to about 12 V, for example, thereby outputting the resultant voltage to an electric component system including a power window, a power steering, or vehicle-mounted electric equipment, etc.

The inverter 504 performs switching operation to convert a direct-current voltage supplied from the boost converter 502 to a three-phase alternating-current voltage, and outputs the resultant voltage to the motor 505. The motor 505 is a three-phase alternating-current motor forming the traveling system of the electric vehicle. The motor 505 is driven to rotate by the three-phase alternating-current voltage output from the inverter 504, and transmits resultant rotary driving power to a wheel of the electric vehicle via a transmission, etc. not illustrated in the drawings.

Meanwhile, measured values such as the rotation speed or torque of the wheel, the amount of depression of an accelerator pedal (the amount of acceleration) are obtained from the electric vehicle during traveling using various types of sensors not illustrated in the drawings, and these measurement signals are input to the driving controller 506. At the same time, an output voltage value from the inverter 504 is also input to the driving controller 506. The driving controller 506 has a function as a controller including an operation unit such as a CPU (central processing unit) and a data storage unit such as a memory. The driving controller 506 generates a control signal using the input measurement signals and outputs the generated control signal as a feedback signal to the inverter 504, thereby controlling switching operation by the switching element. By doing so, an alternating-current voltage to be applied from the inverter 504 to the motor 505 is corrected momentarily to allow driving control over the electric vehicle to be implemented correctly, thereby realizing safe and comfortable operation of the electric vehicle. It is possible to control an output voltage to the inverter 504 by applying the feedback signal from the driving controller 506 to the boost converter 502.

FIG. 8 illustrates a circuit configuration defined by omitting the step-down converter 503 from FIG. 7, namely, a circuit configuration illustrating only a configuration for driving the motor 505. As illustrated in this drawing, the semiconductor device according to the disclosure becomes available for switching control by being used as a Schottky barrier diode, for example, in the boost converter 502 and the inverter 504. The semiconductor device is incorporated in the chopper circuit in the boost converter 502 to control the chopper, and is incorporated in a switching circuit including an IGBT in the inverter 504 to control switching. An inductor (such as a coil) is interposed in the output of the battery 501 to encourage current stabilization. A capacitor (such as an electrolytic capacitor) is interposed between corresponding ones of the battery 501, the boost converter 502, and the inverter 504 to encourage voltage stabilization.

As indicated by dotted lines in FIG. 8, an operation unit 507 composed of a CPU (central processing unit) and a storage unit 508 composed of a nonvolatile memory are provided in the driving controller 506. A signal input to the driving controller 506 is applied to the operation unit 507 and the operation unit 507 performs necessary operation, thereby generating a feedback signal directed to each semiconductor element. The storage unit 508 temporarily retains results of the operation by the operation unit 507, and stores physical constants, functions, etc. in the form of a table necessary for driving control and outputs such constants or functions to the operation unit 507, as appropriate. The operation unit 507 and the storage unit 508 may have publicly-known configurations and are arbitrarily selectable in terms of processing performance, etc.

As illustrated in FIGS. 7 and 8, in the control system 500, diodes or thyristors, power transistors, IGBTs, or MOSFETs as switching elements are used for the switching operations of the boost converter 502, the step-down converter 503, and the inverter 504. Using gallium oxide ($Ga_2O_3$), particularly corundum-type gallium oxide ($\alpha$-$Ga_2O_3$) as a material for these semiconductor elements improves switching characteristics significantly. Moreover, employing the semiconductor device, etc. according to the disclosure is expected to achieve extremely favorable switching characteristics and allows size reduction or cost reduction of the control system 500 to a greater extent. Specifically, each of the boost converter 502, the step-down converter 503, and the inverter 504 is expected to achieve the effect of the disclosure so the effect of the disclosure is expected to be achieved by any one or a combination of any two or more of these devices, or by a configuration defined by incorporating the driving controller 506.

The control system 500 described above realizes application of the semiconductor device according to the disclosure not only to a control system for an electric vehicle but also to control systems for a variety of purposes such as boosting and stepping down of power from a direct-current power supply and conversion of direct-current power to alternating-current power. Moreover, a power supply such as a solar cell is applicable as a battery.

Figure 9:
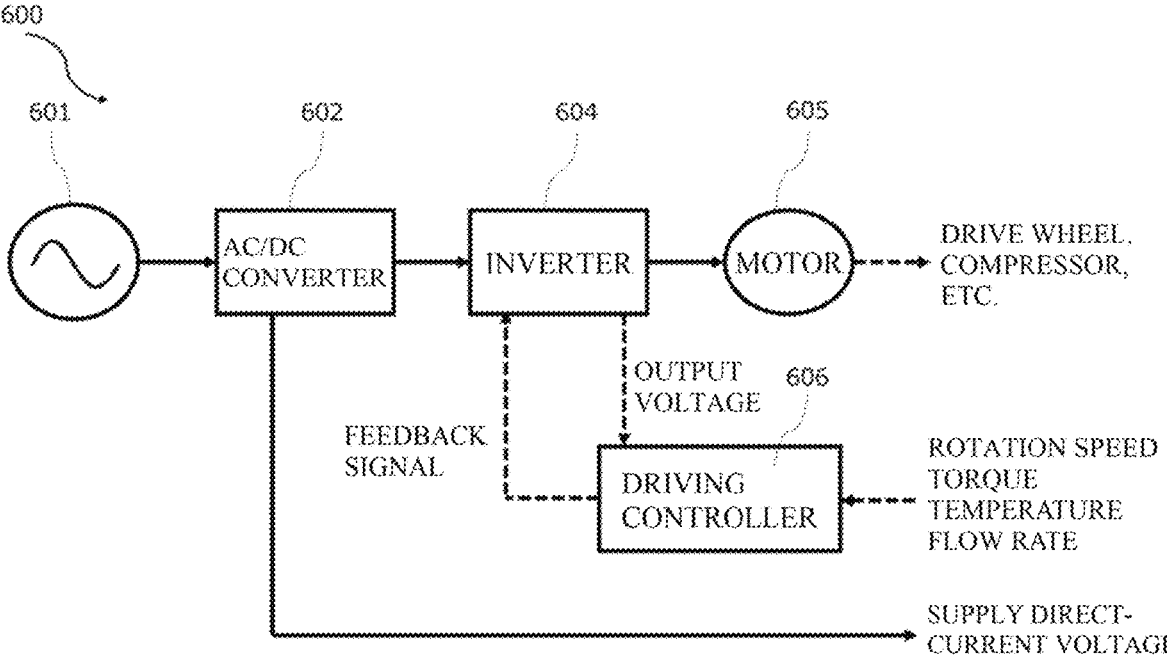
FIG. 9 is a block configuration view illustrating an example of a control system that uses a semiconductor device according to an embodiment of the disclosure.
Figure 10:
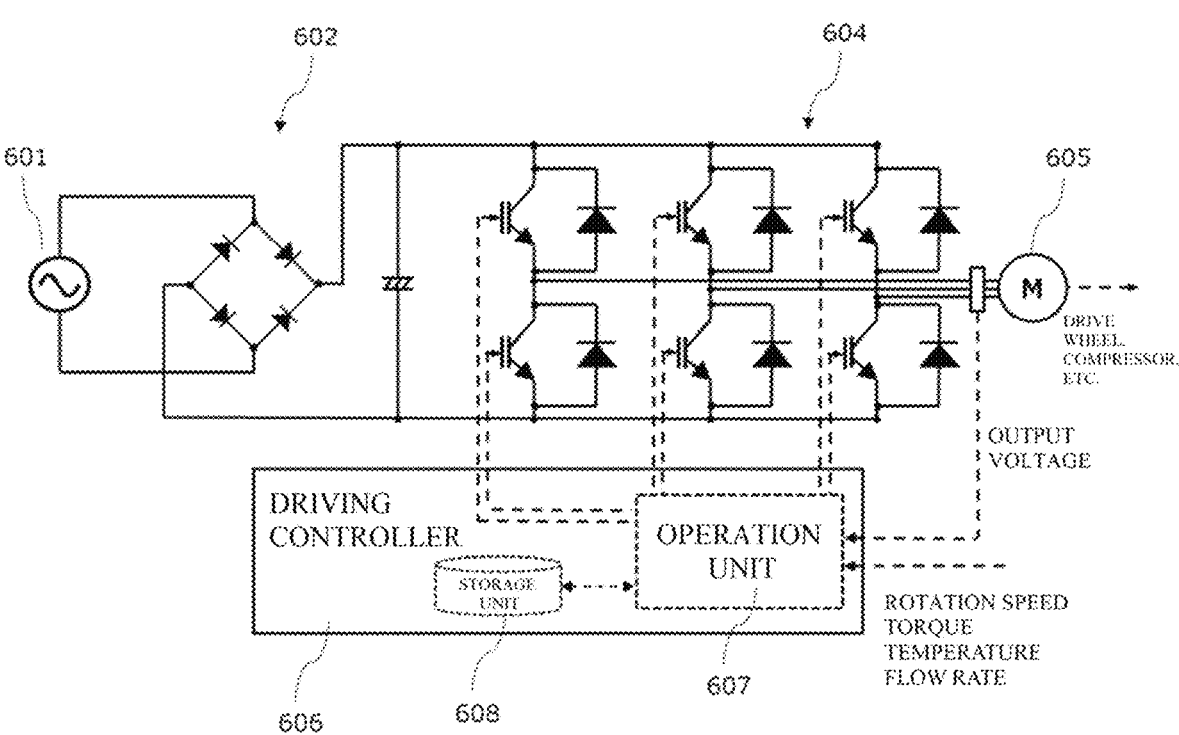
FIG. 10 is a circuit diagram illustrating an example of a control system that uses a semiconductor device according to an embodiment of the disclosure.

FIG. 9 is a block configuration view illustrating another example of a control system that uses a semiconductor device according to an embodiment of the disclosure. FIG. 10 is a circuit diagram of this control system. This control system is suitable for mounting on infrastructure equipment or consumer electronics equipment that is operated by power from an alternating-current power supply.

As illustrated in FIG. 9, a control system 600 receives power supplied from an external three-phase alternating-current power supply (power supply) 601, for example. The control system 600 has an AC/DC converter 602, an inverter 604, a motor (driving target) 605, and a driving controller 606, and these devices are mountable on various types of equipment (described later). The three-phase alternating-current power supply 601 is a power generating facility (such as thermal power plant, hydropower plant, geothermal power plant, or nuclear power plant) of an electric power company, for example. Output from the three-phase alternating-current power supply 601 is supplied as an alternating-current voltage while being stepped down through a substation. As another example, the three-phase alternating-current power supply 601 is installed in a form such as a private power generator in a building or in a neighboring facility, and output therefrom is supplied through a power cable. The AC/DC converter 602 is a voltage converter to convert an alternating-current voltage to a direct-current voltage, and converts an alternating-current voltage such as 100 V or 200 V supplied from the three-phase alternating-current power supply 601 to a predetermined direct-current voltage. More specifically, the alternating-current voltage is converted by the voltage conversion to an intended direct-current voltage generally used such as 3.3 V, 5 V, or 12 V. If a driving target is a motor, the voltage is converted to 12 V. A single-phase alternating-current power supply is applicable instead of the three-phase alternating-current power supply. In this case, a comparable system configuration may be formed by using an AC/DC converter for single-phase input.

The inverter 604 performs switching operation to convert a direct-current voltage supplied from the AC/DC converter 602 to a three-phase alternating-current voltage, and outputs the resultant voltage to the motor 605. The motor 605 has a configuration that changes in response to a control target, and is a three-phase alternating-current motor for driving a wheel if the control target is a train, for driving a pump or various types of power sources if the control target is a plant facility, and for driving a compressor and others if the control target is consumer electronics equipment. The motor 605 is driven to rotate by a three-phase alternating-current voltage output from the inverter 604, and transmits resultant rotary driving power to a driving target not illustrated in the drawings.

In the case of consumer electronics equipment, for example, there are many driving targets capable of receiving direct-current voltages as they are output from the AC/DC converter 602 (such as personal computer, LED liquating equipment, video equipment, and acoustic equipment, for example). In this case, the inverter 604 becomes unnecessary in the control system 600 and a direct-current voltage is supplied from the AC/DC converter 602 to such a driving target, as illustrated in FIG. 14. In this case, a direct-current voltage of 3.3 V is supplied to a personal computer and a direct-current voltage of 5 V is supplied to LED lighting equipment, for example.

Meanwhile, measured values such as the rotation speed or torque of a driving target, or a temperature, a flow rate, etc. in an environment surrounding the driving target are obtained using various types of sensors not illustrated in the drawings, and these measurement signals are input to the driving controller 606. At the same time, an output voltage value from the inverter 604 is also input to the driving controller 606. On the basis of these measurement signals, the driving controller 606 applies a feedback signal to the inverter 604 to control switching operation by the switching element. By doing so, an alternating-current voltage to be applied from the inverter 604 to the motor 605 is corrected momentarily to allow driving control over the driving target to be implemented correctly, thereby realizing stable operation of the driving target. As described above, if the driving target is capable of being driven by a direct-current voltage, it is possible to implement feedback control over the AC/DC converter 602 instead of giving a feedback to the inverter.

FIG. 10 illustrates a circuit configuration in FIG. 9. As illustrated in this drawing, the semiconductor device according to the disclosure becomes available for switching control by being used as a Schottky barrier diode, for example, in the AC/DC converter 602 and the inverter 604. The AC/DC converter 602 to be used has a circuit configuration composed of Schottky barrier diodes in a bridge pattern, for example, and makes direct-current conversion through rectification by converting a negative voltage part of an input voltage to a positive voltage. In the inverter 604, the semiconductor device is incorporated in a switching circuit in an IGBT to control switching. A capacitor (such as an electrolytic capacitor) is interposed between the AC/DC converter 602 and the inverter 604 to encourage voltage stabilization.

As indicated by dotted lines in FIG. 10, an operation unit 607 composed of a CPU and a storage unit 608 composed of a nonvolatile memory are provided in the driving controller 606. A signal input to the driving controller 606 is applied to the operation unit 607 and the operation unit 607 performs necessary operation, thereby generating a feedback signal directed to each semiconductor element. The storage unit 608 temporarily retains results of the operation by the operation unit 607, and stores physical constants, functions, etc. in the form of a table necessary for driving control and outputs such constants or functions to the operation unit 607, as appropriate. The operation unit 607 and the storage unit 608 may have publicly-known configurations and are arbitrarily selectable in terms of processing performance, etc.

Like in the control system 500 illustrated in FIGS. 7 and 8, in the control system 600, diodes or thyristors, power transistors, IGBTs, or MOSFETs as switching elements are used for the rectifying operations or switching operations of the AC/DC converter 602 and the inverter 604. Using gallium oxide ($Ga_2O_3$), particularly corundum-type gallium oxide ($\alpha$-$Ga_2O_3$) as a material for these semiconductor elements improves switching characteristics. Moreover, employing the semiconductor film or the semiconductor device according to the disclosure is expected to achieve extremely favorable switching characteristics and allows size reduction or cost reduction of the control system 600 to a greater extent. Specifically, each of the AC/DC converter 602 and the inverter 604 is expected to achieve the effect of the disclosure so the effect of the disclosure is expected to be achieved by either one or a combination of these devices, or by a configuration defined by incorporating the driving controller 606.

While the motor 605 is illustrated as an example of the driving target in FIGS. 9 and 10, the driving target is not always limited to equipment to operate mechanically but may be various types of equipment requiring an alternating-current voltage. The control system 600 is applicable as long as it drives a driving target to receive power from an alternating-current power supply, and is mountable for driving control over equipment including infrastructure equipment (such as power systems in buildings, plants, etc., communication equipment, traffic control equipment, water and sewage processing equipment, system equipment, labor-saving equipment, and trains, for example) and consumer electronics equipment (refrigerators, washers, personal computers, LED liquating equipment, video equipment, and acoustic equipment, for example).

The semiconductor device according to the disclosure is available in any field including semiconductors (compound semiconductor electronic devices, for example), electronic parts, electric equipment parts, optical electrophotographic related apparatuses, industrial members, and especially useful for power devices.

The embodiments of the present invention are exemplified in all respects, and the scope of the present invention includes all modifications within the meaning and scope equivalent to the scope of claims.

REFERENCE SIGNS LIST

1 Source region ($n^+$-type semiconductor layer)
2 High-resistance layer (current blocking region)
3 $N^+$-type semiconductor layer
4a Gate insulating film
4b Interlayer insulating film
5a Gate electrode
5b Source electrode
5c Drain electrode
6 Channel layer
7 $N^-$-type semiconductor layer
8 Crystalline oxide semiconductor layer
9 Substrate
21 Deposition device (mist CVD device)
22a Carrier gas source
22b Carrier gas (diluted) source
23a Flow rate control valve
23b Flow rate control valve
24 Mist generator
24a Raw material solution
24b Raw material particle
25 Container
25a Water
26 Ultrasonic transducer
27 Deposition chamber
28 Hot plate
29 Supply pipe
30 Substrate
500 Control system
501 Battery (power supply)

502 Boost converter
503 Step-down converter
504 Inverter
505 Motor (driving target)
506 Driving controller
507 Operation unit
508 Storage unit
600 Control system
601 Three-phase alternating-current power supply (power supply)
602 AC/DC converter
604 Inverter
605 Motor (driving target)
606 Driving controller
607 Operation unit
608 Storage unit

What is claimed is:

1. A semiconductor device comprising at least: a crystalline oxide semiconductor layer including a channel layer, a drift layer, and a source region; a gate electrode arranged over the channel layer across a gate insulating film; a current blocking region arranged between the channel layer and the drift layer; and a source electrode provided on the source region, the current blocking region being composed of a high-resistance layer, the source electrode being in direct contact with the current blocking region.

2. The semiconductor device according to claim 1, wherein the crystalline oxide semiconductor layer contains at least one type of metal selected from aluminum, indium, and gallium.

3. The semiconductor device according to claim 1, wherein the crystalline oxide semiconductor layer has a corundum structure.

4. The semiconductor device according to claim 1, wherein the current blocking region contains a dopant.

5. The semiconductor device according to claim 4, wherein the dopant in the current blocking region has a concentration equal to or greater than $1.0 \times \times 10^{17}/cm^3$.

6. The semiconductor device according to claim 1, wherein the current blocking region is an ion-implanted region.

7. The semiconductor device according to claim 1, wherein electron trap density in the current blocking region is equal to or greater than $4.0 \times 10^{18}/cm^3$.

8. The semiconductor device according to claim 1, wherein the semiconductor device is a transistor.

9. A power converter that uses the semiconductor device according to claim 1.

10. A control system that uses the semiconductor device according to claim 1.

\* \* \* \* \*